United States Patent
Lee et al.

(10) Patent No.: US 10,049,763 B2
(45) Date of Patent: *Aug. 14, 2018

(54) SEMICONDUCTOR MEMORY APPARATUS

(71) Applicant: SK hynix Inc., Icheon-si, Gyeonggi-do (KR)

(72) Inventors: Chang Hyun Lee, Icheon-si (KR); Young Jun Ku, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/146,503

(22) Filed: May 4, 2016

(65) Prior Publication Data

US 2016/0284423 A1    Sep. 29, 2016

Related U.S. Application Data

(63) Continuation-in-part of application No. 14/495,988, filed on Sep. 25, 2014, now Pat. No. 9,349,488.

(30) Foreign Application Priority Data

May 13, 2014  (KR) ........................ 10-2014-0057132

(51) Int. Cl.
| | |
|---|---|
| *G01R 31/3181* | (2006.01) |
| *G11C 29/08* | (2006.01) |
| *G11C 29/12* | (2006.01) |
| *G11C 29/26* | (2006.01) |
| *G11C 29/46* | (2006.01) |
| *G11C 29/50* | (2006.01) |
| *G11C 29/56* | (2006.01) |

(52) U.S. Cl.
CPC .... *G11C 29/12015* (2013.01); *G01R 31/3181* (2013.01); *G11C 29/08* (2013.01); *G11C 29/26* (2013.01); *G11C 29/46* (2013.01); *G11C 29/50012* (2013.01); *G11C 29/1201* (2013.01); *G11C 2029/2602* (2013.01); *G11C 2029/5602* (2013.01)

(58) Field of Classification Search
CPC . G11C 29/12015; G11C 29/56; G11C 29/023; G11C 29/26; G11C 29/08; G11C 29/50012; G11C 2029/5602; G11C 29/12; G11C 2029/2602; G11C 29/46
USPC .................................................. 714/718, 724
See application file for complete search history.

(56) References Cited

U.S. PATENT DOCUMENTS

| | | | |
|---|---|---|---|
| 6,097,206 A | 8/2000 | Takano | |
| 6,349,399 B1 * | 2/2002 | Manning | ............. G11C 7/1072 714/739 |
| 6,842,864 B1 | 1/2005 | Barth et al. | |

(Continued)

FOREIGN PATENT DOCUMENTS

| | | |
|---|---|---|
| KR | 1020020010545 A | 2/2002 |
| KR | 1020090061843 A | 6/2009 |

*Primary Examiner* — James C Kerveros
(74) *Attorney, Agent, or Firm* — William Park & Associates Ltd.

(57) ABSTRACT

A semiconductor memory apparatus includes a plurality of stacked semiconductor dies including a first semiconductor die comprising a first internal circuit configured to control input timing of a test control signal that is output as a plurality of delayed test control signals to the plurality of stacked semiconductor dies according to the controlled input timing in response to a test mode signal.

14 Claims, 7 Drawing Sheets

(56) References Cited

U.S. PATENT DOCUMENTS

| | | | |
|---|---|---|---|
| 6,912,680 B1 | 6/2005 | Keeth | |
| 7,603,605 B2 * | 10/2009 | Mittal | G11C 29/02 |
| | | | 714/745 |
| 7,650,555 B2 * | 1/2010 | Imming | G01R 31/2834 |
| | | | 714/25 |
| 7,673,193 B1 | 3/2010 | Ong et al. | |
| 7,694,202 B2 | 4/2010 | Swanson et al. | |
| 7,872,940 B2 * | 1/2011 | Kwean | G11C 29/1201 |
| | | | 365/189.05 |
| 8,924,786 B2 * | 12/2014 | Menon | G11C 29/022 |
| | | | 714/25 |
| 2002/0004922 A1 | 1/2002 | Manning | |
| 2005/0204245 A1 | 9/2005 | Lee et al. | |
| 2008/0168408 A1 | 7/2008 | Mittal | |
| 2009/0013228 A1 | 1/2009 | Jarboe et al. | |
| 2012/0278674 A1 * | 11/2012 | Whetsel | G01R 31/318533 |
| | | | 714/727 |
| 2013/0055039 A1 | 2/2013 | Dearth | |
| 2013/0326294 A1 * | 12/2013 | Lo | G11C 29/16 |
| | | | 714/718 |
| 2014/0006864 A1 * | 1/2014 | Menon | G11C 29/022 |
| | | | 714/32 |
| 2014/0013169 A1 * | 1/2014 | Kobla | G11C 29/18 |
| | | | 714/718 |
| 2014/0281773 A1 * | 9/2014 | Goel | G11C 29/50 |
| | | | 714/726 |

\* cited by examiner

SEMICONDUCTOR MEMORY APPARATUS

CROSS-REFERENCES TO RELATED APPLICATION

This application is a continuation-in-part of application Ser. No. 14/495,988, filed Sep. 25, 2014, titled "SEMICONDUCTOR MEMORY APPARATUS".

BACKGROUND

1. Technical Field

Various embodiments relate to a semiconductor integrated circuit, and more particularly, to a semiconductor memory apparatus.

2. Related Art

Stacking semiconductor dies is developed as capacity of a semiconductor memory apparatus becomes greater. Also, response speed is improved by making each of the stacked dies to independently operate.

However, it is hard to test such semiconductor memory apparatus because there is more limitation of a number of pins to test each of the semiconductor dies after stacking than to test individual semiconductor die. Therefore, it is hard to perform different tests on each of stacked semiconductor dies included in a semiconductor memory apparatus such as when the semiconductor memory apparatus operates in normal condition.

SUMMARY

In an embodiment of the invention, a semiconductor memory apparatus may include a plurality of stacked semiconductor dies including a first semiconductor die including a first internal circuit configured to control input timing of a test control signal that is output as a plurality of delayed test control signals to the plurality of stacked semiconductor dies according to the controlled input timing in response to a test mode signal.

In an embodiment of the invention, a semiconductor memory apparatus may include a plurality of semiconductor dies and a normal signal transfer path configured to set operation modes to each of the plurality of semiconductor dies. In addition, the semiconductor memory apparatus may include a test signal transfer path configured to control the plurality of semiconductor dies to enable the plurality of semiconductor dies to perform operations with the same pattern while the plurality of semiconductor dies perform different operations to each other at the same time in a test mode.

In an embodiment of the invention, a semiconductor memory apparatus may include a plurality of stacked semiconductor dies including a plurality of channels. In addition, one of the plurality of stacked semiconductor dies comprises a first interface configured to receive a test control signal, delay the test control signal with different delay amounts for each of the plurality of channels, and input the delayed test control signal to each of the plurality of channels in a test mode.

DETAILED DESCRIPTION

Hereinafter, a semiconductor apparatus will be described below with reference to the accompanying figures through various embodiments.

Figure 1:
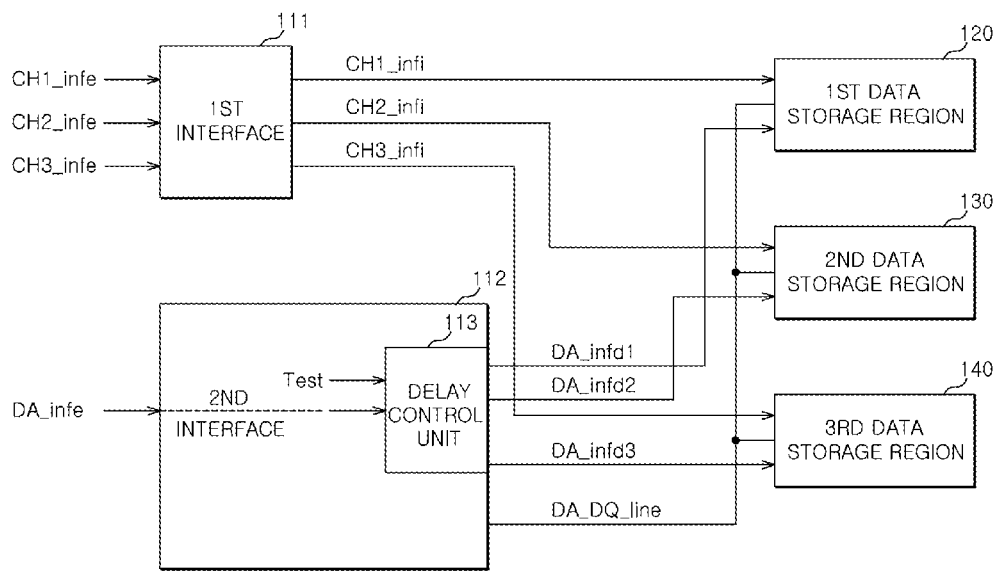
FIG. 1 is a block diagram illustrating a semiconductor memory apparatus in accordance with an embodiment of the invention.

Referring to FIG. 1, a semiconductor memory device in accordance with an embodiment may include a first interface 111, a second interface 112, and first to third data storage regions 120, 130, and 140. One or more of the first and second interfaces 111 and 112 may include all internal circuits to receive and transmit signals in the semiconductor memory apparatus. The first and second interfaces 111 and 112 may represent internal circuits.

The first interface 111 may transfer first to third control signals $CH1\_infi$, $CH2\_infi$, and $CH3\_infi$ to the first to third data storage regions 120, 130, and 140. For example, the first interface 111 may be electrically coupled to a controller 300 shown in FIG. 5. The first interface 111 may also receive the first to third external control signals $CH1\_infe$, $CH2\_infe$, and $CH3\_infe$ from the controller 300. The first interface 111 may also output the first to third external control signals $CH1\_infe$, $CH2\_infe$, and $CH3\_infe$ as the first to third control signals $CH1\_infi$, $CH2\_infi$, and $CH3\_infi$ to the first to third data storage regions 120, 130, and 140. Each of the first to third control signals $CH1\_infi$, $CH2\_infi$, and $CH3\_infi$ may be a signal (clock, address, and command) to set operations of the first to third data storage regions 120, 130, and 140.

The second interface 112 may be electrically coupled to an external test device, receive a test control signal $DA\_infe$ from the external test device, and output the test control signal $DA\_infe$ to the first to third data storage regions 120, 130, and 140 with different output timing. The test control signal $DA\_infe$ transferred to the first data storage region 120 is referred to as a first delay test control signal $DA\_infd1$. The test control signal $DA\_infe$ transferred to the second data storage region 130 is referred to as a second delay test control signal $DA\_infd2$. In addition, the test control signal $DA\_infe$ transferred to the third data storage region 140 is referred to as a third delay test control signal $DA\_infd3$. The first to third delay test control signals $DA\_infd1$, $DA\_infd2$, and $DA\_infd3$ may be respectively delayed test control signal $DA\_infe$ with different delay. In detail, the second interface 112 may include a delay control unit or delay control circuit 113. The delay control unit 113 may output the first to third delay test control signals $DA\_infd1$, $DA\_infd2$, and $DA\_infd3$ with different delays by delaying the test control signal $DA\_infe$ with a different delay in response to a test mode signal TEST. In addition, the second interface 112 may transmit and receive data using a test data line $DA\_DQ\_line$ commonly coupled to the first to third data storage regions 120, 130, and 140.

The first data storage region 120 may operate in response to the first control signal CH1_infi and the first delay test control signal DA_infd1. For instance, the first data storage region 120 may perform active, write, precharge, read, and refresh operations in response to each of the first control signal CH1_infi and the first delay test control signal DA_infd1.

The second data storage region 130 may operate in response to the second control signal CH2_infi and the second delay test control signal DA_infd2. For example, the second data storage region 130 may perform active, write, precharge, read, and refresh operations in response to the second control signal CH2_infi and the second delay test control signal DA_infd2.

The third data storage region 140 may operate in response to the third control signal CH3_infi and the third delay test control signal DA_infd3. For instance, the third data storage region 140 may perform active, write, precharge, read, and refresh operations in response to the third control signal CH3_infi and the third delay test control signal DA_infd3. Each of the first to third data storage regions 120, 130, and 140 may form different channels to perform different operations.

Figure 2:
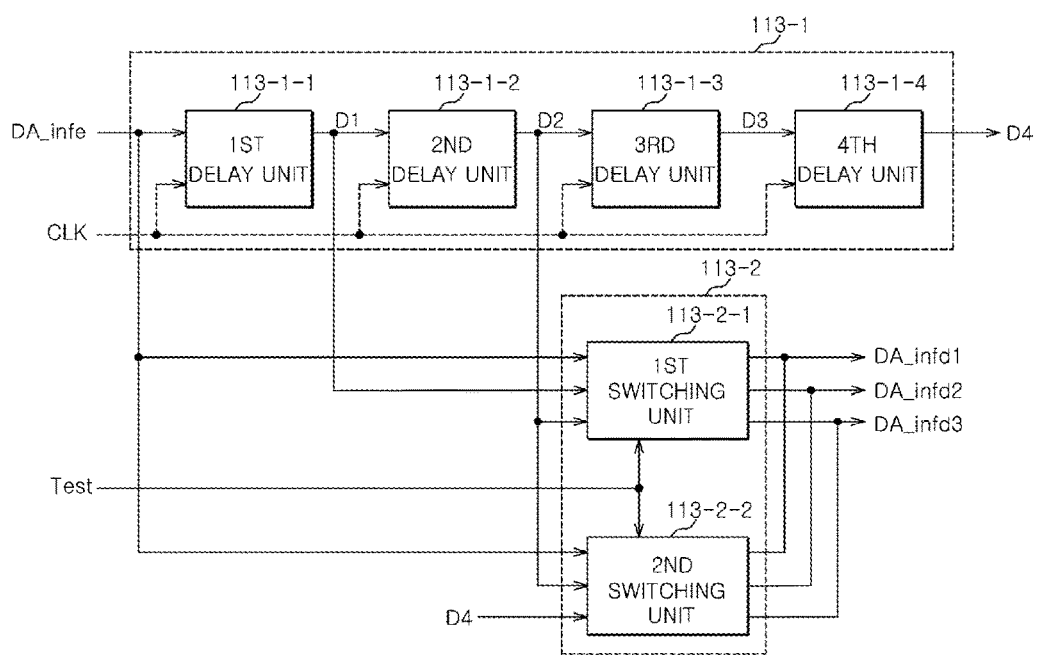
FIG. 2 is a block diagram illustrating a delay control unit shown in FIG. 1.

Referring to FIG. 2, the delay control unit 113 may include a delay chain 113-1 and a selection part 113-2.

The delay chain 113-1 may include first to fourth delay units or first to fourth delay circuits 113-1-1, 113-1-2, 113-1-3, and 113-1-4, electrically coupled in series. The first delay unit 113-1-1 may receive and delay the test control signal DA_infe, and output a first delay signal D1. The second delay unit 113-1-2 may receive and delay the first delay signal D1, and output a second delay signal D2. The third delay unit 113-1-3 may receive and delay the second delay signal D2, and output a third delay signal D3. The fourth delay unit 113-1-4 may receive and delay the third delay signal D3, and output a fourth delay signal D4. The first to fourth delay units 113-1-1, 113-1-2, 113-1-3, and 113-1-4 may be a synchronous delay unit such as a flip-flop to delay an input signal in response to a clock CLK, or a plurality of inverters serially coupled or an RC delay circuit to delay an input signal without synchronization to a clock CLK.

The selection part 113-2 may select each of the output signals D1, D2, D3, and D4 of the first to fourth delay units 113-1-1, 113-1-2, 113-1-3, and 113-1-4. The selection part 113-2 may also output the selected signals to the first to third data storage regions 120, 130, and 140 in response to the test mode signal TEST.

The selection part 113-2 may include first and second switching units or first and second switching circuits 113-2-1, and 113-2-2.

The first switching unit 113-2-1 may output the test control signal DA_infe, the first delay signal D1, and the second delay signal D2 as the first delay test control signal DA_infd1, the second delay test control signal DA_infd2, and the third delay test control signal DA_infd3 respectively in response to the test mode signal TEST. For example, the first switching unit 113-2-1 may output the test control signal DA_infe as the first delay test control signal DA_infd1. The first switching unit 113-2-1 may also output the first delay signal D1 as the second delay test control signal DA_infd2. Further, the first switching unit 113-2-1 may also output the second delay signal D2 as the third delay test control signal DA_infd3 when the test mode signal TEST is enabled.

The second switching unit 113-2-2 may output the test control signal DA_infe, the second delay signal D2, and the fourth delay signal D4 as the first delay test control signal DA_infd1, the second delay test control signal DA_infd2, and the third delay test control signal DA_infd3, respectively in response to the test mode signal TEST. For example, the second switching unit 113-2-2 may output the test control signal DA_infe as the first delay test control signal DA_infd1. The second switching unit 113-2-2 may also output the second delay signal D2 as the second delay test control signal DA_infd2. In addition, the second switching unit 113-2-2 may output the fourth delay signal D4 as the third delay test control signal DA_infd3 when the test mode signal TEST is disabled.

Figure 3:
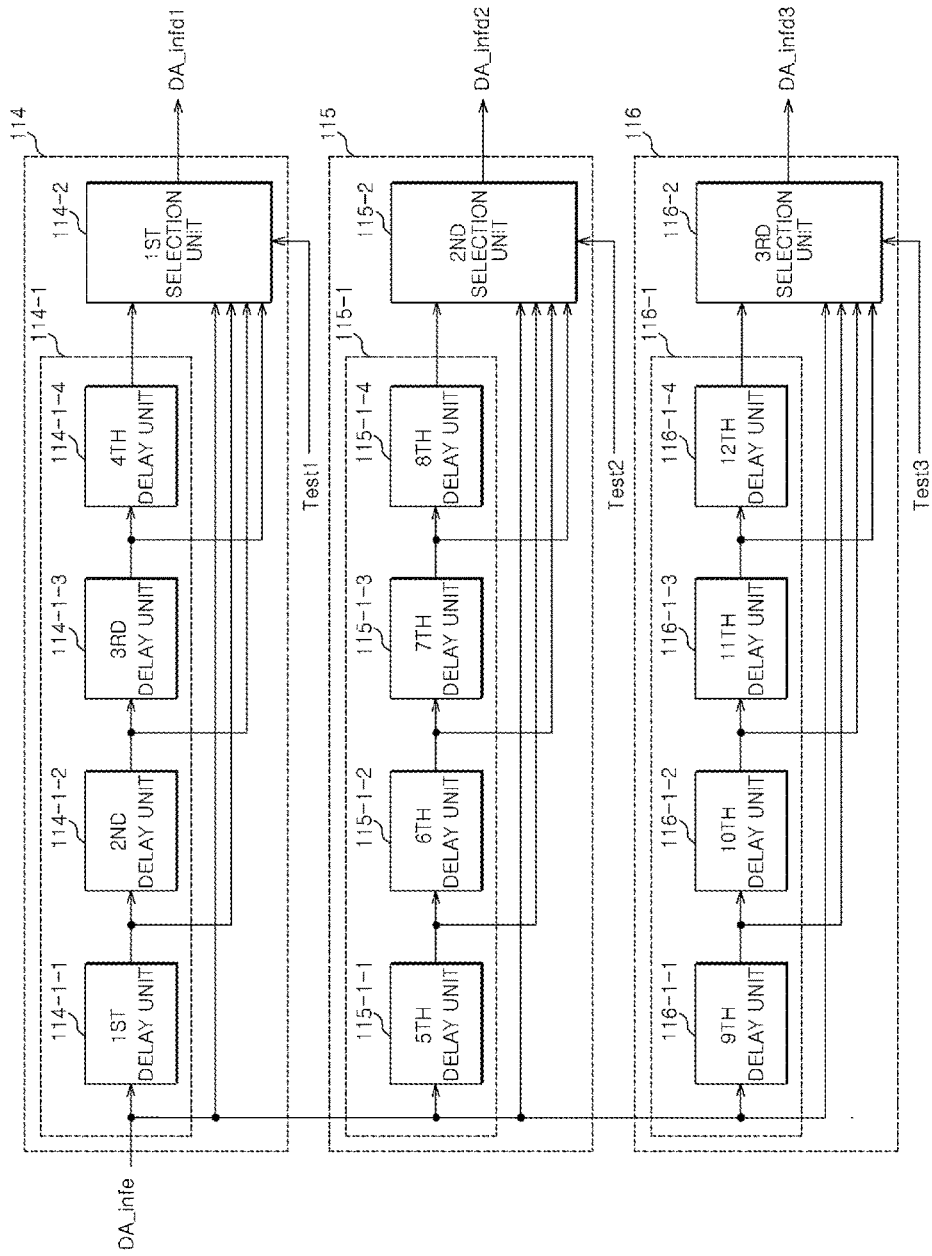
FIG. 3 is a block diagram illustrating a delay control unit shown in FIG. 1.

Referring to FIG. 3, an embodiment of the delay control unit 113 is shown. The delay control unit 113 may include first to third selection and output parts or first to third selection and output circuits 114, 115, and 116.

The first selection and output part 114 may include a first delay chain 114-1, and a first selection unit or first selection circuit 114-2. The first delay chain 114-1 may include first to fourth delay units or first to fourth delay circuits 114-1-1, 114-1-2, 114-1-3, and 114-1-4 electrically coupled in series. The first delay unit 114-1-1 may receive and delay the test control signal DA_infe. The second delay unit 114-1-2 may receive and delay an output of the first delay unit 114-1-1. The third delay unit 114-1-3 may receive and delay an output of the second delay unit 114-1-2. The fourth delay unit 114-1-4 may receive and delay an output of the third delay unit 114-1-3. The first selection unit 114-2 may output one of the outputs of the first to fourth delay units 114-1-1, 114-1-2, 114-1-3, and 114-1-4, and the test control signal DA_infe as the first delay test control signal DA_infd1 according to a first test mode signal TEST1.

The second selection and output part or second selection and output circuit 115 may include a second delay chain 115-1, and a second selection unit or second selection circuit 115-2. The second delay chain 115-1 may include fifth to eighth delay units or fifth to eighth delay circuits 115-1-1, 115-1-2, 115-1-3, and 115-1-4 electrically coupled in series. The fifth delay unit 115-1-1 may receive and delay the test control signal DA_infe. The sixth delay unit 115-1-2 may receive and delay an output of the fifth delay unit 115-1-1. The seventh delay unit 115-1-3 may receive and delay an output of the sixth delay unit 115-1-2. The eighth delay unit 115-1-4 may receive and delay an output of the seventh delay unit 115-1-3. The second selection unit 115-2 may output one of the outputs of the fifth to eighth delay units 115-1-1, 115-1-2, 115-1-3, and 115-1-4, and the test control signal DA_infe as the second delay test control signal DA_infd2 in response to a second test mode signal TEST2.

The third selection and output part or third selection and output circuit 116 may include a third delay chain 116-1, and a third selection unit or third selection circuit 116-2. The third delay chain 116-1 may include ninth to twelfth delay units or ninth to twelfth delay circuits 116-1-1, 116-1-2, 116-1-3, and 116-1-4 electrically coupled in series. The ninth delay unit 116-1-1 may receive and delay the test control signal DA_infe. The tenth delay unit 116-1-2 may receive and delay an output of the ninth delay unit 116-1-1. The eleventh delay unit 116-1-3 may receive and delay an output of the tenth delay unit 116-1-2. The twelfth delay unit 116-1-4 may receive and delay an output of the eleventh delay unit 116-1-3. The third selection unit 116-2 may output one of the outputs of the ninth to twelfth delay units 116-1-1, 116-1-2, 116-1-3, and 116-1-4, and the test control signal DA_infe as the third delay test control signal DA_infd3 according to a third test mode signal TEST3.

An operation of the semiconductor memory apparatus in accordance with an embodiment is as follows.

Control operation of the first to third data storage regions 120, 130, and 140 through the first interface 111 is as follows. A signal transfer path to control the first to third data storage regions 120, 130, and 140 through the first interface 111 is referred to as a normal signal transfer path.

The first to third external control signals CH1_infe, CH2_infe, and CH3_inf3 inputted from an external system or the like may be output through the first interface 111 as the first to third control signals CH1_infi, CH2_infi, and CH3_infi.

The first data storage region 120 may perform operations related to data storage, data output, and data maintenance such as active, write, precharge, read, and refresh operations according to the first control signal CH1_infi.

The second data storage region 130 may perform operations related to data storage, data output, and data maintenance such as active, write, precharge, read, and refresh operations in response to the second control signal CH2_infi.

The third data storage region 140 may perform operations related to data storage, data output, and data maintenance such as active, write, precharge, read, and refresh operations according to the third control signal CH3_infi.

Control operation of the first to third data storage regions 120, 130, and 140 through the second interface 112 is as follows. A signal transfer path to control the first to third data storage regions 120, 130, and 140 through the second interface 112 is referred to as a test signal transfer path.

The test control signal DA_infe may be inputted from an external device to the second interface 112, and outputted as the first to third delay test control signals DA_infd1, DA_infd2, and DA_infd3. The second interface 112 may be configured to determine a delay amount for the test control signal DA_infe. The second interface 112 may also output the first to third delay test control signals DA_infd1, DA_infd2, and DA_infd3 by delaying the test control signal DA_infe with the determined delay amount in response to the test mode signal TEST. The first to third delay test control signals DA_infd1, DA_infd2, and DA_infd3 may be respectively delayed test control signal DA_infe with the same or different delay.

A process to generate the first to third delay test control signals DA_infd1, DA_infd2, and DA_infd3 by delaying the test control signal DA_infe in response to the test mode signal TEST will be described with reference to FIGS. 2 and 3.

Referring to FIG. 2, the test control signal DA_infe may be inputted to the delay chain 113-1. The delay chain 113-1 may include the first to fourth delay units 113-1-1, 113-1-2, 113-1-3, and 113-1-4 electrically coupled in series. The first switching unit 113-2-1 may output the test control signal DA_infe as the first delay test control signal DA_infd1. The first switching unit 113-2-1 may also output the first delay signal D1, which is the output of the first delay unit 113-1-1, as the second delay test control signal DA_infd2. Further, the first switching unit 113-2-1 may output the second delay signal D2, which is the output of the second delay unit 113-1-2, as the third delay test control signal DA_infd3 when the test mode signal TEST is enabled. The second switching unit 113-2-2 may output the test control signal DA_infe as the first delay test control signal DA_infd1. In addition, the second switching unit 113-2-2 may output the second delay signal D2, which is the output of the second delay unit 113-1-2, as the second delay test control signal DA_infd2. The second switching unit 113-2-2 may also output the fourth delay signal D4, which is the output of the fourth delay unit 113-1-4, as the third delay test control signal DA_infd3 when the test mode signal TEST is disabled.

More specifically, the delay control unit 113, which may be included in the second interface 112 shown in FIG. 2, may respectively input the first to third delay test control signals DA_infd1, DA_infd2, and DA_infd3 to the first to third data storage regions 120, 130, and 140 with a delay amount corresponding to a single delay unit. In the alternative, the delay amount may correspond to two delay units according to the test mode signal TEST.

Referring to FIG. 3, the test control signal DA_infe may be inputted to the first to third delay chains 114-1, 115-1, and 116-1. Each of the first to third delay chains may include four delay units 114-1-1 to 114-1-4, 115-1-1 to 115-1-4, and 116-1-1 to 116-1-4, respectively. The first selection unit 114-2 may select one of the outputs of the first to fourth delay units 114-1-1, 114-1-2, 114-1-3, and 114-1-4 included in the first delay chain 114-1, and the test control signal DA_infe. The first selection unit 114-2 may also output the selected signal as the first delay test control signal DA_infd1 in response to the first test mode signal TEST1. The second selection unit 115-2 may select one of the outputs of the fifth to eighth delay units 115-1-1, 115-1-2, 115-1-3, and 115-1-4 included in the second delay chain 115-1, and the test control signal DA_infe. The second selection unit 115-2 may also output the selected signal as the second delay test control signal DA_infd2 in response to the second test mode signal TEST2. The third selection unit 116-2 may output one of the outputs of the ninth to twelfth delay units 116-1-1, 116-1-2, 116-1-3, and 116-1-4 included in the third delay chain 116-1, and the test control signal DA_infe. The third selection unit 116-2 may also output the selected signal as the third delay test control signal DA_infd3 in response to the third test mode signal TEST3.

More specifically, the delay control unit 113, which may be included in the second interface 112 shown in FIG. 3, may determine delay amounts for the test control signal DA_infe. Further, the delay control unit 113 may output the first to third delay test control signals DA_infd1, DA_infd2, and DA_infd3 by delaying the test control signal DA_infe with the determined delay amounts in response to the first to third test mode signals TEST1, TEST2, and TEST3, respectively. In other words, the delay amounts of the first to third delay test control signals DA_infd1, DA_infd2, and DA_infd3 may be the same or may be different from each other. Therefore, the input timing of the first to third delay test control signals DA_infd1, DA_infd2, and DA_infd3 to the corresponding first to third data storage regions 120, 130, and 140 may be the same or may be different from each other.

Figure 4:
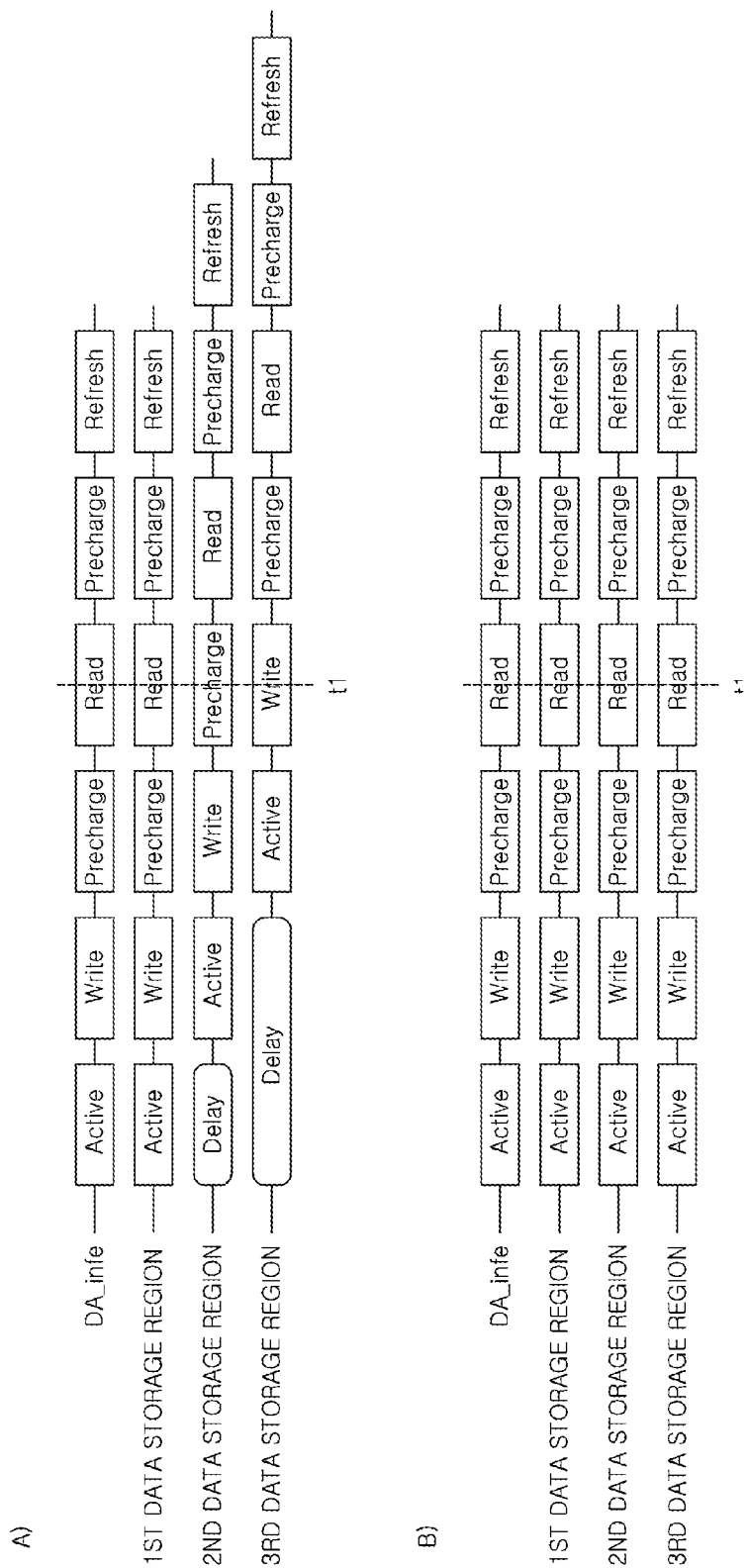
FIG. 4 is a timing diagram illustrating an operation of a semiconductor memory apparatus in accordance with an embodiment of the invention.

According to an embodiment, the first to third data storage regions 120, 130, and 140 may perform different operations from each other at a time point such as T1 shown in FIG. 4, by controlling input timing of the test control signal DA_infe, which is to control operations of the first to third data storage regions 120, 130, and 140, to the first to third data storage regions 120, 130, and 140. In addition, the first to third data storage regions 120, 130, and 140 may perform the same operation.

Referring to FIG. 4, it is assumed that the test control signal DA_infe is inputted to the first to third data storage regions 120, 130, and 140 for sequential active, write, precharge, read, precharge, and refresh operations of the first to third data storage regions 120, 130, and 140 in order.

Referring to FIG. 4 A), each of the first to third data storage regions 120, 130, and 140 may sequentially perform active, write, precharge, read, precharge, and refresh operations, while the second data storage region 130 may perform the operations later than the first data storage region 120. In addition, the third data storage region 140 may perform the operations later than the second data storage region 130. When seen at a specific time point T1, the first data storage region 120 may perform the read operation. In addition, the second data storage region 130 may perform the precharge operation. Further, the third data storage region 140 may perform the write operation. That is, the first to third data storage regions 120, 130, and 140 may perform different operations to each other. In addition, the first to third data storage regions 120, 130, and 140 may perform the read operation at different time point to each other. Accordingly results of the read operations of the first to third data storage regions 120, 130, and 140 may be sequentially obtained through the common test data line DA_DQ_line shown in FIG. 1.

Referring to FIG. 4B), the test control signal DA_infe is inputted to the first to third data storage regions 120, 130, and 140 without delay. Therefore, the first to third data storage regions 120, 130, and 140 perform the same operation at a specific time point T1.

As such, a plurality of data storage regions of the semiconductor memory apparatus in accordance with an embodiment may have the same operation pattern, for example sequential order of the active, write, precharge, read, precharge, and refresh operations, with different operation timing from each other. Accordingly, the plurality of data storage regions may perform different operations from each other at a specific time point.

Figure 5:
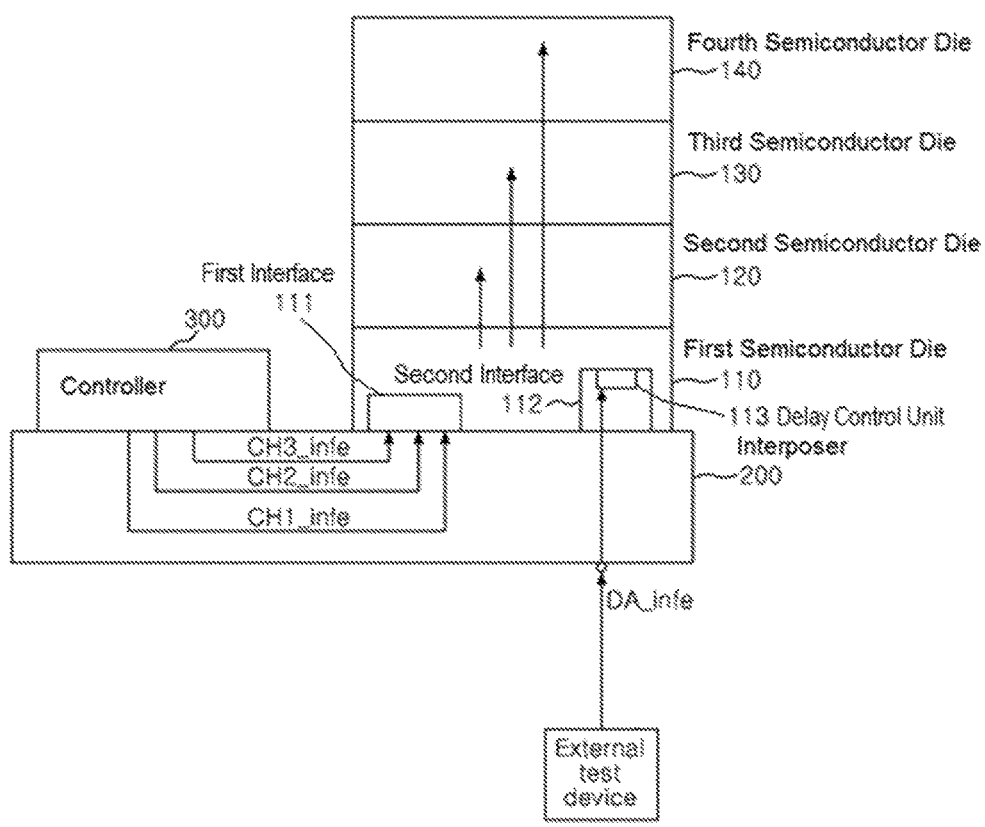
FIG. 5 is a schematic diagram illustrating a semiconductor memory apparatus in accordance with an embodiment of the invention.

Referring to FIG. 5, a schematic diagram illustrating a semiconductor memory apparatus shows a plurality of stacked semiconductor dies.

The semiconductor memory apparatus in an embodiment may include first to fourth semiconductor dies 110, 120, 130, and 140, which are stacked.

The first semiconductor die 110 may be electrically coupled to an interposer 200.

The second semiconductor die 120 may be stacked on the first semiconductor die 110.

The third semiconductor die 130 may be stacked on the second semiconductor die 120.

The fourth semiconductor die 140 may be stacked on the third semiconductor die 130. All of the first to fourth semiconductor dies 110, 120, 130, and 140 may store data, or the second and fourth semiconductor dies 120 and 140 among the first to fourth semiconductor dies 110, 120, 130, and 140 may store data. The first to fourth semiconductor dies 110, 120, 130, and 140 may be electrically coupled to each other.

One of the first to fourth semiconductor dies 110, 120, 130, and 140, for example the first semiconductor die 110 may include a first interface 111 electrically coupled to a controller 300 through the interposer 200. In addition, the first semiconductor die 110 may include a second interface 112 electrically coupled to an external device such as an external test device, through the interposer 200. The second interface 112 may include the delay control unit 112 described above with reference to FIGS. 2 and 3.

During a normal operation, each of the first to fourth semiconductor dies 110, 120, 130, and 140 may determine its operation mode in response to control signals transferred from the controller 300 through the interposer 200 and the first interface 111.

During a test operation, a test control signal, which may be transferred from the external device through the interposer 200 and the second interface 112, may be delayed and inputted to the first to fourth semiconductor dies 110, 120, 130, and 140, and each of the first to fourth semiconductor dies 110, 120, 130, and 140 may also determine its operation mode according to the inputted test control signal.

As described with reference to FIGS. 2 and 3, the second interface 112 may determine input timing of the test control signal DA_infe to the first to fourth semiconductor dies 110, 120, 130, and 140 in response to the test mode signals TEST, or TEST1, TEST2, and TEST3. In other words, the delay control unit 113 included in the second interface 112 may determine delay amounts of the test control signal DA_infe for each of the first to fourth semiconductor dies 110, 120, 130, and 140 according to the test mode signals TEST, or TEST1, TEST2, and TEST3.

For example, as described with reference to FIG. 4, it is assumed that the test control signal DA_infe is inputted to the first to fourth semiconductor dies 110, 120, 130, and 140 for sequential active, write, precharge, read, precharge, and refresh operations of the first to fourth semiconductor dies 110, 120, 130, and 140 in order.

The first semiconductor die 110 shown in FIG. 5, which may correspond to the first data storage region 120 shown in FIG. 1, may be configured to work with the same timing of the test control signal DA_infe.

The second semiconductor die 120 shown in FIG. 5, which may correspond to the second data storage region 130 shown in FIG. 1, may be configured to work with a time lag behind the first semiconductor die 110.

The third semiconductor die 130 shown in FIG. 5, which may correspond to the third data storage region 140 shown in FIG. 1, may be configured to work with a time lag behind the second semiconductor die 120.

The fourth semiconductor die 140 shown in FIG. 5 may be configured to work with a time lag behind the third semiconductor die 130.

The first to fourth semiconductor dies 110, 120, 130, and 140 may perform different operations from each other at a specific time point T1.

As such, in accordance with various embodiments, the semiconductor memory apparatus described above with reference to FIGS. 1 to 3 may be applied to the semiconductor memory device having the plurality of stacked semiconductor dies described above with reference to FIG. 5.

Figure 6:
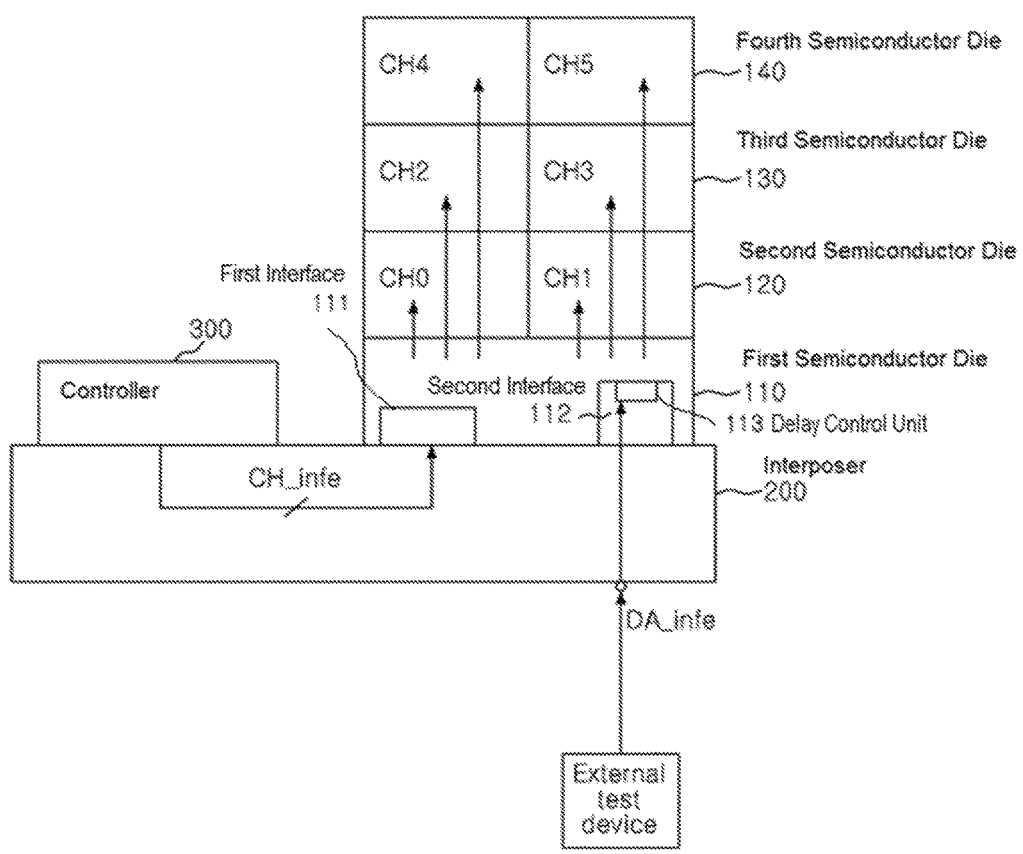
FIG. 6 is a schematic diagram illustrating a semiconductor memory apparatus in accordance with an embodiment of the invention and FIG. 7 illustrates a block diagram of a system employing a memory controller circuit in accordance with an embodiment of the invention.

Referring to FIG. 6, a schematic diagram illustrating a semiconductor memory apparatus shows a plurality of stacked semiconductor dies. Each of the semiconductor dies may include a plurality of channels. Channels mean groups which independently use signals such as a command signal, an address signal and data. Accordingly the semiconductor memory apparatus may increase bandwidth by distinguishing channels.

The semiconductor memory apparatus in an embodiment may include first to fourth semiconductor dies 110, 120, 130, and 140, which are stacked. The two to fourth semiconductor 120, 130, 140 may be allocated with different channels, respectively.

The first semiconductor die 110 may be electrically coupled to an interposer 200.

The second semiconductor die 120 may be stacked on the first semiconductor die 110. The second semiconductor die 120 may include first and second channels(CH0, CH1)

The third semiconductor die 130 may be stacked on the second semiconductor die 120. The third semiconductor die 130 may include third and fourth channels(CH2, CH3)

The fourth semiconductor die 140 may be stacked on the third semiconductor die 130. The fourth semiconductor die 140 may include fifth and sixth channels(CH4, CH5)

All of the first to fourth semiconductor dies 110, 120, 130, and 140 may store data, or the second and fourth semiconductor dies 120 and 140 among the first to fourth semiconductor dies 110, 120, 130, and 140 may store data. The first to sixth channels CH0, CH1, CH2, CH3, CH4, CH5 including the second to fourth semiconductor dies 120, 130, 140 may store data. The first to fourth semiconductor dies 110, 120, 130, and 140 may be electrically coupled to each other.

One of the first to fourth semiconductor dies 110, 120, 130, and 140, for example the first semiconductor die 110 may include a first interface 111 electrically coupled to a controller 300 through the interposer 200. The first interface 111 electrically is configured to to individually set an operation mode of each of the plurality of channels CH0, CH1, CH2, CH3, CH4, CH5 under control of the external controller 300.

In addition, the first semiconductor die 110 may include a second interface 112 electrically coupled to an external device such as an external test device, through the interposer 200. The second interface 112 comprises a delay control unit configured to determine the delay amounts of a test control signal, and respectively input delayed test control signals having different delay amounts to the plurality of channels CH0, CH1, CH2, CH3, CH4, CH5 in response to a test mode signal.

During a normal operation, each of the first to fourth semiconductor dies 110, 120, 130, and 140 may determine its operation mode in response to control signals CH_infe transferred from the controller 300 through the interposer 200 and the first interface 111.

Figure 7:
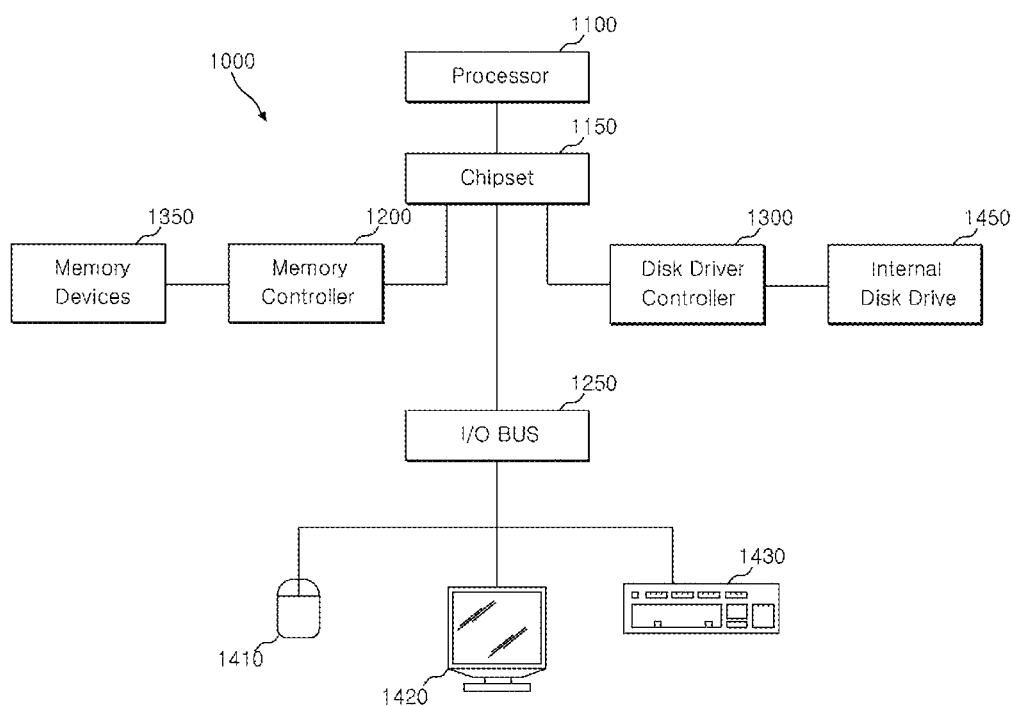

During a test operation, the test control signal, which may be transferred from the external device through the interposer 200 and the second interface 112, may be delayed and inputted to the first to fourth semiconductor dies 110, 120, 130, and 140, and each of the first to fourth semiconductor dies 110, 120, 130, and 140 may also determine its operation mode according to the inputted test control signal. Also, the test control signal may be delayed and inputted to the first to sixth channels CH0, CH1, CH2, CH3, CH4, CH5 and each of the first to sixth channels CH0, CH1, CH2, CH3, CH4, CH5 may determine its operation mode according to the inputted test control signal. Referring to FIG. 7, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor memory device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset using virtually any type of communication protocol.

While certain embodiments have been described above, it will be understood to those skilled in the art that the embodiments described are by way of example only. Accordingly, the semiconductor memory apparatus should not be limited based on the described embodiments. Rather, the semiconductor memory apparatus described should only be limited in light of the claims that follow when taken in conjunction with the above description and accompanying figures.

What is claimed is:
1. A semiconductor memory apparatus comprising:
a plurality of stacked semiconductor dies including a first semiconductor die comprising a first internal circuit configured to input a plurality of control signals to the plurality of stacked semiconductor dies, and a second internal circuit configured to delay a test control signal to generate a plurality of delayed test control signals and output the plurality of delayed test control signals to the plurality of stacked semiconductor dies in response to a test mode signal,
wherein the first internal circuit includes a first interface directly coupled to an external controller and configured to receive the plurality of control signals from the external controller,
wherein the second internal circuit includes a second interface directly coupled to an external test device, and configured to receive the test control signal from the external test device,
wherein the second internal circuit comprises a delay control unit configured to control an input timing of the delayed test control signal to each of the plurality of stacked semiconductor dies in response to the test mode signal, and
wherein the delay control unit inputs the delayed test control signal to each of the plurality of stacked semiconductor dies with different input timings in response to the test mode signal.
2. The semiconductor memory apparatus of claim 1, wherein the delay control unit comprises:
a delay chain including a plurality of serially coupled delay units configured to receive the test control signal; and
a selection unit configured to select each output of the plurality of delay units, and output the selected output to each of the plurality of semiconductor dies in response to the test mode signal.
3. The semiconductor memory apparatus of claim 2, wherein the delay unit is one of a synchronized delay unit configured to work in synchronization with a clock, and a non-synchronized delay unit configured to work without synchronization to the clock.
4. The semiconductor memory apparatus of claim 2, wherein the delay chain is configured to receive the test control signal and a clock signal, and output a delayed signal to the selection unit, and the selection unit is configured to receive the delayed signal and the test mode signal and output the delayed test control signal to a semiconductor die in response to the test mode signal.

5. The semiconductor memory apparatus of claim 1, wherein the delay control unit comprises:
a plurality of delay chains each configured to receive the test control signal, and each of which includes a plurality of serially coupled delay units; and
a plurality of selection units, each of which outputs an output of the plurality of delay units included in a corresponding one of the plurality of delay chains.

6. The semiconductor memory apparatus of claim 5, wherein the plurality of selection units are configured to receive outputs of the plurality of delay chains and the test control signal to output the delayed test control signal to a semiconductor die within the plurality of stacked semiconductor dies.

7. A semiconductor memory apparatus comprising:
a plurality of semiconductor dies;
a normal signal transfer path configured to set operation modes of each of the plurality of semiconductor dies; and
a test signal transfer path configured to control the plurality of semiconductor dies to enable the plurality of semiconductor dies to perform operations with a same pattern while the plurality of semiconductor dies perform different operations to each other in a test mode,
wherein the normal signal transfer path includes a first interface directly coupled to an external controller,
wherein the test signal transfer path includes a second interface directly coupled to an external test device,
wherein the second interface comprises a delay control unit configured to delay a test control signal to generate a plurality of delayed test control signals and output the plurality of delayed test control signals to the plurality of semiconductor dies in response to a test mode signal,
wherein the delay control unit is configured to control an input timing of the delayed test control signal to each of the plurality of semiconductor dies in response to the test mode signal, and
wherein the delay control unit inputs the delayed test control signal to each of the plurality of semiconductor dies with different input timings in response to the test mode signal.

8. The semiconductor memory apparatus of claim 7, wherein the normal signal transfer path receives a plurality of control signals to individually set an operation mode of each of the plurality of semiconductor dies from an external controller, and input the plurality of control signals to the plurality of semiconductor dies.

9. The semiconductor memory apparatus of claim 7, wherein the test signal transfer path receives the test control signal to set an operation mode of the plurality of semiconductor dies from an external test device, delay the test control signal with different delay amounts for each of the plurality of semiconductor dies, and input the delayed test control signal to each of the plurality of semiconductor dies.

10. The semiconductor memory apparatus of claim 9, wherein the test signal transfer path determines the delay amounts of the test control signal in response to the test mode signal.

11. The semiconductor memory apparatus of claim 10, wherein the delay control unit comprises:
a plurality of delay units, which are serially coupled;
a selection unit configured to transfer an output of the plurality of delay units to one of the plurality of semiconductor dies in response to the test mode signal.

12. The semiconductor memory apparatus of claim 9, wherein each of the plurality of stacked semiconductor dies work through different channels.

13. A semiconductor memory apparatus comprising each of a plurality of stacked semiconductor dies including a plurality of channels, wherein one of the plurality of stacked semiconductor dies comprises a first interface electrically configured to individually set an operation mode of each of the plurality of channels under control of an external controller in a normal mode, and a second interface configured to receive a test control signal, delay the test control signal with different delay amounts, and input the delayed test control signal to each of the plurality of channels in a test mode,
wherein the second interface is directly coupled to the external controller, and the first interface is directly coupled to the external test device,
wherein the second interface comprises:
a delay control unit configured to determine the delay amounts of the test control signal, and respectively input delayed test control signals having different delay amounts to the plurality of stacked semiconductor dies through the plurality of channels in response to a test mode signal; and
an external test device configured to input the test control signal.

14. The semiconductor memory apparatus of claim 13, wherein the delay control unit comprises:
a delay chain including a plurality of delay units which are serially coupled and delay the test control signal; and
a selection unit configured to select each output of the plurality of serially coupled delay units, and output the selected output to each of the plurality of channels in response to the test mode signal.

* * * * *